(12) United States Patent
Boufounos et al.

(10) Patent No.: US 8,204,718 B2
(45) Date of Patent: Jun. 19, 2012

(54) METHOD FOR RECONSTRUCTING SPARSE STREAMING SIGNALS USING GREEDY SEARCH

(75) Inventors: Petros T. Boufounos, Boston, MA (US); Muhammad S. Asif, Atlanta, GA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 400 days.

(21) Appl. No.: 12/648,423

(22) Filed: Dec. 29, 2009

(65) Prior Publication Data
US 2011/0161052 A1    Jun. 30, 2011

(51) Int. Cl.
*H03F 1/26* (2006.01)
(52) U.S. Cl. ..................................... 702/189
(58) Field of Classification Search .............. 702/189
See application file for complete search history.

(56) References Cited

U.S. PATENT DOCUMENTS

| | | | |
|---|---|---|---|
| 7,054,792 B2 * | 5/2006 | Frei et al. ...................... | 702/190 |
| 2010/0241378 A1 * | 9/2010 | Baraniuk et al. ................ | 702/66 |
| 2011/0107164 A1 * | 5/2011 | Boufounos ................... | 714/746 |

* cited by examiner

*Primary Examiner* — Aditya Bhat
(74) *Attorney, Agent, or Firm* — Dirk Brinkman; Gene Vinokur

(57) ABSTRACT

A method reconstructs a streaming signal $x_n$ from streaming measurements by maintaining a working set of measurements, a working snapshot of the measurement system, an internal working signal estimate, and an external working signal estimate. Using a current working set of measurements, the internal working signal estimates, the working snapshot of the measurement system, and a model of a signal sparsity are refined. The external working signal estimate is refreshed. A subset of coefficients of the external working signal estimate is committed to an output. A next streaming measurement and a corresponding next measurement vector are received. The working set of measurements, the working snapshot of the measurement system, and the internal working signal estimate are updated to incorporate the next measurement and the corresponding measurement vector. Then, an oldest measurement and a corresponding oldest measurement vector, and an effect of the committed subset of coefficients are removed.

8 Claims, 5 Drawing Sheets

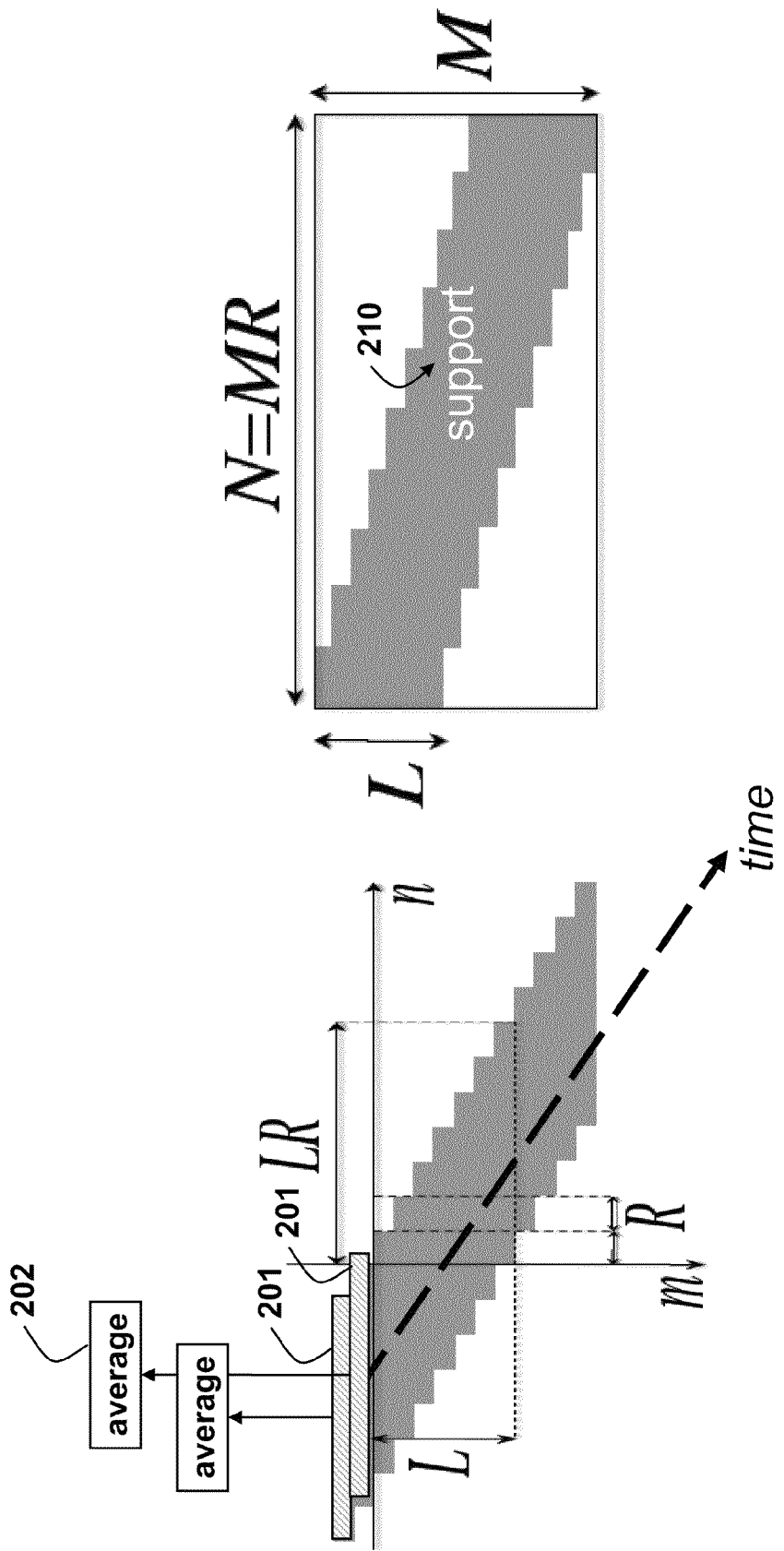

Iterate: Reconstruction of streaming signal
1: Increase iteration count: $i \leftarrow i+1$
2: Refine internal working estimate:
$$\widetilde{\mathbf{x}}^i \leftarrow \text{Refine}(\widehat{\mathbf{x}}^{i-1}, \mathbf{y}^{i-1}, \mathbf{A}^{i-1}),$$
where Refine(·) is shown in Figure 5
3: Refresh and update external working estimate:
$$\overline{\mathbf{x}}^i \leftarrow \mathbf{W}_E \overline{\mathbf{x}}^{i-1} + \mathbf{W}_I \widetilde{\mathbf{x}}^i,$$
where $\mathbf{W}_E$ and $\mathbf{W}_I$ are $N \times N$ matrices.
4: Commit coefficients to the output:
$$\widehat{x}_{Ri+j} = \overline{\mathbf{x}}_j^i, \ j=1,\ldots,R$$
where $\widehat{x}_n$ is the streaming signal estimate at the output.
5: Update the working variables:
$$\widehat{\mathbf{x}}^i \leftarrow \mathbf{S}\widetilde{\mathbf{x}}^i$$
$$\mathbf{y}^i \leftarrow \begin{bmatrix} \mathbf{y}^i_{\{2,\ldots,M\}} \\ y_{i+M} \end{bmatrix}$$
$$\mathbf{A}^i \leftarrow \begin{bmatrix} \mathbf{A}^{i-1}_{\{2,\ldots,M\},\{R+1,\ldots,N\}} \\ a_{(i+M),\{R+1,\ldots,N\}} \end{bmatrix} - \begin{bmatrix} \mathbf{A}^{i-1}_{\{2,\ldots,M\},\{1,\ldots,R\}} & \mathbf{0}_{(N-R)} \\ a_{(i+M),\{R(i-1)+1,Ri\}} \end{bmatrix} \begin{bmatrix} \widehat{x}_{Ri+1} \\ \vdots \\ \widehat{x}_{Ri+R} \end{bmatrix}$$

where $\mathbf{S}$ is a shifting matrix, according to the appropriate signal model.

*Fig. 3*

Refinement

Inputs: *Current internal working signal estimate* $\hat{\mathbf{x}}$, *working measurements set* $\mathbf{y}$, *working measurement system snapshot* $\mathbf{A}$ 1: *Compute unexplained residual:*

$$\mathbf{r} = \mathbf{y} - \mathbf{A}\hat{\mathbf{x}},$$

2: *Compute proxy to identify support:*

$$\mathbf{p} = (\mathbf{A}_P)^H \mathbf{r},$$

where $\mathbf{A}_P$ is a proxy computation matrix based on the working snapshot of the measurement system $\mathbf{A}$, and $(\cdot)^H$ denotes the Hermitian transpose.

3: *Identify and combine support:*

$$\Omega = \mathrm{supp}\,(\mathbf{B}\mathbf{V}\hat{\mathbf{x}}) \cup \mathrm{supp}\,(\mathbf{p}|_T),$$

where $\mathrm{supp}(\cdot)$ denotes the support index set of a vector, and $\mathbf{p}|_T$ denotes truncation of the vector $\mathbf{p}$ to its $T$ largest in magnitude coefficients 4: *Estimate signal components over the merged support:*

$$\mathbf{b} = ((\mathbf{W}_R \mathbf{A}(\mathbf{B}\mathbf{V})^{-1})|_\Omega)^\dagger \mathbf{W}_R \hat{\mathbf{y}}$$

5: *Truncate components and compute the new estimate:*

$$\tilde{\mathbf{s}} \leftarrow \mathbf{b}|_K$$
$$\tilde{\mathbf{x}} \leftarrow (\mathbf{B}\mathbf{V})^{-1} \tilde{\mathbf{s}}.$$

Output: *Refined internal working signal estimate* $\tilde{\mathbf{x}}$

*Fig. 5*

METHOD FOR RECONSTRUCTING SPARSE STREAMING SIGNALS USING GREEDY SEARCH

FIELD OF THE INVENTION

This invention is generally related to sparse signals, and more particularly to reconstructing sparse streaming signals.

BACKGROUND OF THE INVENTION

It is well known that a signal must be sampled at a rate that is at least twice its highest frequency to represent the signal without error, i.e., the Nyquist rate. However, most signals of interest can often be compressed after sampling. This demonstrates that such signals have structure that has not been exploited in the sampling process—often referred to as acquisition process. Clearly, this wastes resources. Sparsity is one of the most common forms of signal structure. Compressive sensing (CS) can be used to efficiently acquire and then reconstruct such sparse signals.

CS leverages the sparsity structure of the signals to enable sampling at rates significantly lower than the Nyquist rate. CS uses randomized, linear, non-adaptive measurements, followed by reconstruction using nonlinear optimization. The success of CS has provided systems and methods, which place significant emphasis on randomized incoherent measurements during acquisition, and increased computation during the signal reconstruction.

However, the emphasis in the development of conventional CS-based systems has not been on streaming signals. Instead, conventional reconstruction focus on finite-length signals, i.e., the signal length is known in advance. Furthermore, the execution time and the processing required by such reconstruction increases significantly as the signal length increases.

When conventional CS hardware and acquisition techniques are used to acquire sparse streaming signals, such as audio and video signals, the signal is typically processed as discrete blocks having finite lengths. Each discrete block is individually compressively sampled and individually reconstructed using a known finite dimensional method.

Using this blocking approach with conventional methods can introduce significant artifacts at boundaries between the blocks. Furthermore, conventional methods cannot provide guarantees on the processing delay for the individual blocks, which often is a critical requirement for real-time systems that produce streams of video or audio data. Thus, significant buffering of the input or excessive allocation of processing resources is needed to satisfy delay requirements.

FIG. 1A shows the general form of a conventional signal acquisition and reconstruction system. FIG. 1B shows an equivalent discretized version of the system in FIG. 1A.

A signal x(t) 101 is acquired using an acquisition system (Acq.) 110 at an average rate of M samples per time unit represented in $y_m$ 102. The signal is reconstructed (Recon.) 120 as an estimated signal $\hat{x}(t)$ 103. Most conventional acquisition systems use an analog-to-digital converter (ADC), which obtains linear measurements using a low-pass anti-aliasing filter followed by uniform time sampling, and quantization. The reconstruction component (Recon.) 120 in conventional systems is a digital-to-analog converter (DAC), which performs linear band limited interpolation of the samples $y_m$.

FIG. 1B shows a discrete equivalent of the system in FIG. 1A, using a discrete representation $x_n$ 104 of the signal x(t) by N coefficients per time period. In conventional band limited sampling and interpolating, $x_n$=x(nT), where T is the Nyquist period. In this case, the acquisition and reconstruction components are an identity, i.e., m=n, and $\hat{x}_n$ 105=$y_n$ 102=$x_n$ 104, and the estimated signal $\hat{x}(t)$ is a band limited interpolation of $\hat{x}_n$.

The Nyquist theorem states that the sampling rate M must be equal to or greater than the input rate N. Otherwise, the system is not invertible and information can be lost. However, with additional information on the signal structure, it is possible to acquire a signal at a sampling rate M that is much smaller than the input rate, and still allow reconstruction. Sparsity is an example of such information exploited by Compressive Sensing.

With CS, a sparse or compressible finite-length signal x can be efficiently sampled and reconstructed using very few linear measurements. The signal x is measured according to $$y = \Phi x, \quad (1)$$

where y denotes a measurement vector, and $\Phi$ is a measurement matrix. The signal x is K sparse, i.e., the signal has only K non-zero coefficients.

Under some conditions on the measurement matrix, the signal can be reconstructed using a convex optimization $$\hat{x} = \underset{x}{\operatorname{argmin}} \|x\|_1 \text{ s.t. } y = \Phi x. \quad (2)$$

The measurement matrix $\Phi$ has a restricted isometry property (RIP) of order 2K. The RIP is satisfied if there exists a constant $\delta_{2K} < 1$, such that for K-sparse signals x $$(1-\delta_{2K})\|x\|_2^2 \leq \|\Phi x\|_2^2 \leq (1+\delta_{2K})\|x\|_2^2. \quad (3)$$

The RIP characterizes matrices that behave as if they are nearly orthonormal when operating on sparse vectors. If the RIP constant $\delta_{2K}$ of the measurement matrix $\Phi$ is sufficiently small, then the convex optimization in Equation (2) provides exact reconstruction of the signal x. Furthermore, a small RIP guarantees recovery in the presence of measurement noise, and for sampling signals that are not sparse but can be well approximated by a sparse signal.

The RIP is also sufficient to provide similar guarantees when using certain greedy reconstruction algorithms instead of convex optimization. Such greedy methods recover the support of the signal using a greedy search, and reconstruct the signal over that support only using linear reconstruction. The greedy search is usually performed within an iterative feedback loop using an unexplained residual to improve the estimate of the support for the signal x.

Most hardware implementations of CS enable the implementation of random projections that satisfy the RIP. However, it is assumed that the signal is processed in finite length blocks. Each block is compressively sampled and reconstructed using one of the known finite dimensional methods (such as the aforementioned convex optimization or greedy algorithms), independent of other blocks. However, a streaming signal and the corresponding acquired measurements are essentially continuous infinite dimensional vectors. Thus, reconstruction using a conventional finite dimensional method does not work.

A formulation for streaming signals poses significant difficulties compared to a fixed-length signal. A streaming signal and the corresponding measurements are essentially infinite dimensional vectors. Thus, the usual CS definitions of sparsity and dimensionality reduction are not valid and need to be reformulated as rates.

Another method in the prior art can be used to reconstruct infinite-dimensional signals. However, that method explicitly assumes the signal has a multiband structure in the frequency domain. That method attempts to recover that structure using a separate system component. That method then uses this structure to control the reconstruction. That method provides no computational and input-output delay guarantees, and is not suitable for streaming signals that are sparse in the time or some other domain.

Therefore, it is desired to have a method that can reconstruct streaming signals that are sparse in an arbitrary domain, such as time, wavelets or frequency.

SUMMARY OF THE INVENTION

The embodiments of the invention provide a real-time method for explicitly reconstructing a streaming signal that is sparse in the time or frequency domain with guaranteed computational cost.

BRIEF DESCRIPTION OF THE DRAWINGS

FIG. 2A is a schematic of parameters of a measurement system according to embodiments of the invention;

FIG. 2B is a schematic of a restricted isometry property for the measurement system of FIG. 2A;

FIG. 3 is a block diagram of pseudo code of a method for reconstructing a sparse signal according to embodiments of the invention;

FIG. 5 is a block diagram of pseudo code of estimation and refinement steps of the method of FIG. 3.

DETAILED DESCRIPTION OF THE PREFERRED EMBODIMENTS

Figure 1B:
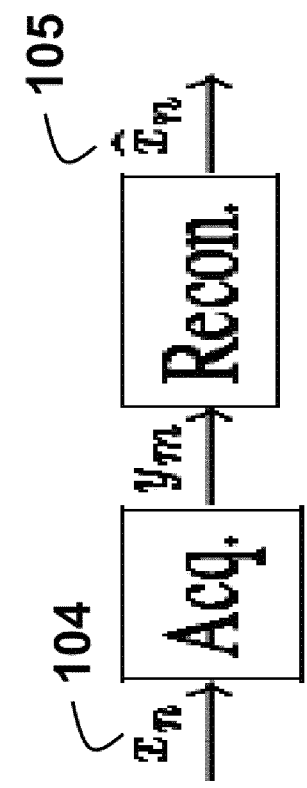
FIG. 1B is a block diagram of a conventional discretized signal acquisition and reconstruction system.
Figure 1A:
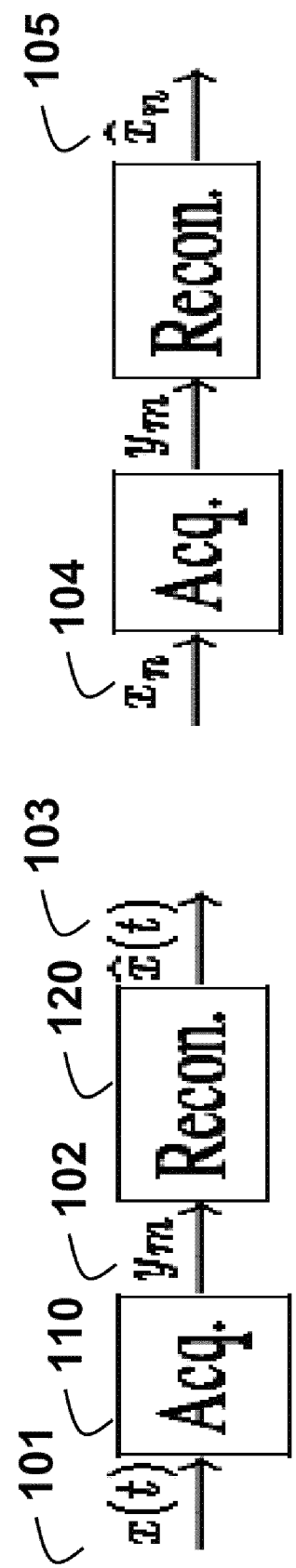
FIG. 1A is a block diagram of a conventional signal acquisition and reconstruction system.

In this description, the following conventions and symbols are used: italics lowercase x, y, a are used to denote the whole signal, the measurements and the measurement system. Boldface x, y, A, are used to denote working snapshots of the signal, the measurements and the measurement system.

Furthermore, the following conventions and symbols are used above variables. The symbols in the description and claims may be omitted for clarity: The caret "^" denotes internal estimate, the tilde "~" denotes refined estimate and the bar "−" denotes external estimate.

Measurement System

We measure a sparse streaming signal x using a real-time varying linear system $a_{m,n}$ as $$y_m = \sum_n x_n a_{m,n} = \langle x, a_m \rangle, \quad (4)$$

where $y_m$ is a sequence of measurements, and $a_m$ is the sequence of measurement vectors. The system has an input rate of N coefficients per unit time for $x_n$, and an measurement (output) rate of M=N/R measurements per unit time, where R denotes an integer downsampling rate. The rates and length described herein are integer multiples of each other. Non-integer rates are straightforward to accommodate with appropriate use of rounding operators. However, the notation becomes cumbersome without adding any insight to the fundamental concepts of the invention.

The measurement system is causal and has a finite response length L. Measurement causality is an essential aspect of any streaming formulation, while the length of the finite response is a mathematical convenience, specific to the invention. Extending the formulation to handle infinite length responses is straightforward, but we avoid it here because it is notationally cumbersome.

Several options exist to implement a finite length support. For example, when sampling time-sparse signals, a recommended choice is that the linear system $a_{m,n}$ has non-zero support in $$n=(m-L)R+1, \ldots, mR, \quad (5)$$

$$\Leftrightarrow m=\lceil n/R \rceil, \ldots, \lceil n/R \rceil + L - 1 \quad (6)$$

Similarly, for frequency-sparse signals, a recommended choice is that the support is non-zero in $$n=mR, \ldots, m(R+L)-1$$

$$\Leftrightarrow m=\lfloor n/R \rfloor - L + 1, \ldots, \lfloor n/R \rfloor.$$

There is number of hardware architectures that can be used to implement such a measurement system. For example, for acoustic or radio signals, the measurement system can be implemented using L interleaved random demodulators, each operating with a measurement period LR. Similarly for video signals, the measurement system can also be implemented using a strobing camera architecture.

Sliding Window

Instead of measuring the streaming data on discrete blocks, as is done on conventional CS systems, the embodiments of the measurement system use a continuous sliding window 201 across the streaming data, as shown in FIG. 2A and described by Equation (4). During each time step or iteration, the sliding is moved forward to include the R most recent values at the front of the window, and removing the R least recent values at the end of the window. In part, the computations are performed on all the values inside the window to produce a single value for each measurement, which essentially is a weighted moving average of the streaming data.

Reconstruction

The reconstruction is performed R samples at a time, using a sliding snapshot of the entire system that captures the state of the system at the current time. Specifically, as described below, the embodiments actually use four sliding constructs including: sliding internal working coefficient estimate $\hat{x}^i$, sliding external working coefficient estimate $\bar{x}^i$, sliding working measurements $y^i$, and a sliding snapshot of the measurement system $A^i$, see FIGS. 3, 4A-4B.

System Parameters

FIG. 2A summarizes the relevant parameters of a linear system $a_{m,n}$ as a function of time. The shaded area 210 indicates support of the system relative to the axes m and n. The system coefficients are non-zero in the shaded area, and zero elsewhere.

Sparsity Model and RIP

The signal is sparse in the time domain with at most K non-zero coefficients for any sequence of N signal coefficients. The sparsity rate S is K/N.

As shown in FIG. 2B, the RIP for the measurement system considers time windows of length N. In each window, the RIP is defined by Equation (3).

In a randomized measurement system, any arbitrary length N window of the system response satisfies the RIP if L=O(K log(N/K)). The system coefficients are randomly distributed with a variance 1/L and any sub-Gaussian distribution (e.g., Gaussian or Rademacher distributions). For a frequency-domain sparse signal, the RIP condition becomes M=O(K log (N/K)). Establishing the RIP over the fixed length window given the structure of the signal sparsity is one of the system design considerations.

The system is sufficiently stable to ensure that local reconstruction errors do not propagate to any subsequent reconstruction. Furthermore, the top and bottom L measurements in each window are also affected by signal components outside that continuous moving window, which are accounted for by our reconstruction method.

Reconstruction of Sparse Streaming Signal

Figure 4B:
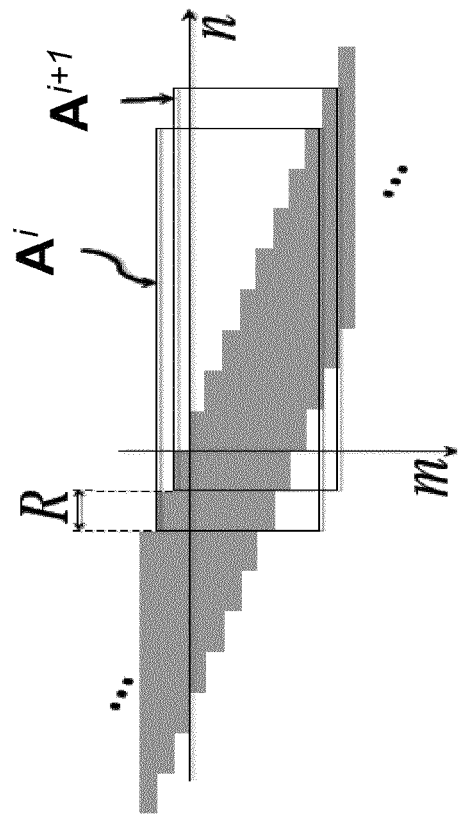
FIG. 4A-4B are schematics of an evolution of a working matrix according to embodiments of the invention.
Figure 4A:
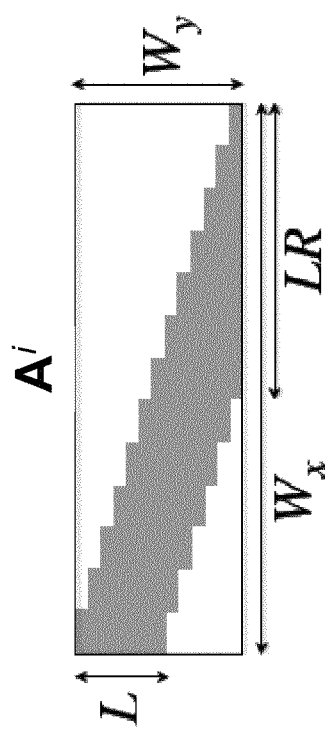

FIG. 3 shows the pseudo-code for the reconstruction method according to the embodiments of the invention. FIGS. 4A-4B show the parameters used by the method.

The reconstructed signal x is estimated on iterations of a sliding window of $W_x$ signal coefficients using $W_y$ measurements and $W_x \times W_y$ size snapshot of the measurement system. After each iteration, the most recent R coefficients are included in the coefficient window, and the least recent R coefficient is removed from the window, and output as the estimate of the reconstructed signal.

Similarly, the most recent measurement is incorporated at the end of the measurement window and the oldest measurement is removed from the beginning. Furthermore, the working measurements window is updated such that the effect of committed coefficients is removed from the measurements in the snapshot of the system, i.e., the updated measurements are characterized only from the uncommitted coefficients.

During every $i^{th}$ iteration (step 1), the method maintains a snapshot of the system which comprises an internal working coefficient estimate of length $W_x$, denoted by $\hat{x}^i$, an external working coefficient estimate of length $W_x$, denoted by $\bar{x}^i$, a snapshot of the measurement system $A^i$ of dimension $W_y \times Wx$, and a working measurement vector of length $W_y$, denoted $y^i$.

The method refines the internal working estimate (step 2) using the Refine procedure shown in FIG. 5. Then, the method combines the refined internal working estimate $\tilde{x}^i$ with the external working estimate from the previous iteration $\bar{x}^{i-1}$ to refresh and slide the external working estimate $\bar{x}^i$ (step 3).

The first R coefficients of the refreshed external estimate are then committed to the output (step 4). The method then receives a next measurement $y_{i+m}$ and a next measurement vector $\alpha_{\{i+M\},\{R(i-1)+1,Ri\}}$, and updates the snapshot of the current state of the system (step 5), i.e., the internal working coefficient estimate $\hat{x}^i$, the snapshot of the measurement system $A^i$, and the working measurement vector $y^i$. The update incorporates the new measurement and the new measurement vector in and discards the oldest measurement and the oldest measurement vector from $y^i$ and $A^i$, respectively. Furthermore, it updates $y^i$ to remove the effect of the committed measurements and shifts $\hat{x}^i$ to update the sliding in time of the snapshot.

A measurement matrix $A^i$, and its evolution after each iteration with respect to the system $a_{m,n}$, are shown in FIGS. 4A-4B, which shows that the true measurements $y_m$ do not necessarily reflect the working measurements $(y)_{\{1,\ldots,L\}}$ corresponding to the first L rows of the working matrix $A^i$. The working measurements, which correspond to the uncommitted part of the signal, are updated as part of Step 5.

Any error in the committed coefficients is propagated back to the working measurements and increases the error in subsequent estimates. Such errors can be due to initial conditions, RIP failures of the measurement system, or sparsity model mismatches for the streaming signal. Still, it is possible to demonstrate that the SGP method is stable and recovers from such errors.

The matrices S, $W_E$, and $W_I$ are algorithmic parameters that should be set depending on the structure of the signal and the requirements of the application.

For example, if the signal is sparse in the time domain, the external and the internal working estimates can be the same. Thus, $W_E$ should be the zero matrix and $W_I$ should be the identity matrix. Furthermore, S should be the left shift operator matrix, which shifts the signal by R coefficients.

If the signal is sparse in the frequency domain, or if the application requires the external estimate to be an average of the internal estimates, then the $W_E$ should be a left shift operator matrix, which shifts the signal by R coefficients, and $W_I$ should be a diagonal matrix with the weights of the average in it main diagonal. Furthermore, for frequency domain sparse signals S should by a cyclical shift operator matrix. In general, S should be such that the sparsity of the internal signal estimate does not change.

Signal Estimation and Refinement

The refinement in step 2 of FIG. 3 is shown in FIG. 5. In step 1 of FIG. 5, the method computes the unexplained residual in the current working measurement window and in step 2 it forms a signal proxy to explain the residual. In step 3, the method identifies the T largest coefficients and merges their support set with the support of the current signal estimate.

Then in step 4, the method re-estimates the signal by solving a least squares problem over the merged support in the appropriate sparsity domain. Finally, the method truncates the solution to the K largest coefficients in step 5.

The matrix B represents the domain in which the signal is sparse. For example, the matrix can be the Fourier transform matrix if the signal is sparse in the frequency (Fourier) domain, or a wavelet transform matrix if the signal is sparse in the wavelet domain. It can also be the identity (or, equivalently, be completely removed from the equations) if the signal is sparse in the time domain.

The matrix V represents a virtual window applied to the signal to improve the estimation. The matrix V should be a diagonal matrix with the coefficients of this window on its main diagonal. For time-domain sparse signals this window is usually set to the identity (i.e. no window) and the matrix can be removed from the equations. For frequency-domain sparse signals, the performance of the algorithm increases if V is set to compute a smooth window, such as a Kaiser, a Gaussian, a Hamming or a Hanning window.

The matrix $W_R$ represents a weight vector, which reflects the confidence in the measurements, as the have been incorporated to the system and as they satisfy the RIP.

The matrix $A_P$ is a matrix that depends on the system parameters, used to compute the proxy. The preferred embodiments set it to $$A_P = A(BV)^{-1}, \text{ or to}$$

$$A_P = (W_P (A(BV)^{-1})^\dagger)^H,$$

where $(.)^\dagger$ denotes the pseudoinverse operation, $(.)^H$ denotes the Hermitian transpose, and $W_P$ is a diagonal weight matrix. The former setting is computationaly simpler to perform within the Refine function, while the latter performs better Refinement.

The number of support elements T potentially added to the support set at every iteration is small, compared to the sparsity K of the signal. This guarantees a small computational cost for each iteration. In addition, the proxy and the least squares problem can be computed using a weight w on the measurements, with lesser weight on the most recent L measurements. This discourages adding the last LR coefficients in the support when only some of the measurements affected by the coefficients are available, making the proxy and their estimates less reliable.

These coefficients correspond to the lower right L×LR portion of the measurement matrix $A^i$, which makes the matrix in FIG. 4A different than the matrix in FIG. 2B. With a fixed working window $W_y$, as L increases, the probability of satisfying the RIP for denser signals increases and the estimation improves.

However, a larger portion of the working matrix $A^i$ is occupied by the lower right part, making the estimation less reliable. A longer working window $W_x$ reduces that effect but increases the computational cost and the delay.

EFFECT OF THE INVENTION

The reconstruction method according to embodiments of the invention is particularly suitable for streaming data, such as audio or video signals. The method operates at a fixed input rate, reconstructs with a fixed cost per input measurement and outputs the estimated streaming signal at a fixed output rate.

By using a sliding window, the method explicitly avoids processing the signal in blocks, and therefore avoids blocking artifacts. Furthermore, the method provides strict performance guarantees, and explicit trade-offs between input-output delay, reconstruction performance and computation. These features make the method well suited for real-time applications, and explicit reconstruction for signals that are sparse in the time-domain.

The method can also be easily modified to accommodate variations in the signal models and the measurement process established in the literature, such as alternative non-sparse signal models, quantized measurements, and non-linearly distorted measurements. The modifications only require straightforward changes in the refinement step, as established in the literature for non-streaming methods.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A computer implemented method for reconstructing a streaming signal $x_n$ from streaming measurements by maintaining, using sliding windows, a working set of measurements, a working snapshot of a measurement system, an internal working signal estimate, and an external working signal estimate, comprising the steps of:
    refining, using a current working set of measurements, the internal working signal estimates, the working snapshot of the measurement system, and a model of a signal sparsity;
    refreshing the external working signal estimate;
    committing a subset of coefficients of the external working signal estimate to an output;
    receiving a next streaming measurement and a corresponding next measurement vector;
    updating the working set of measurements, the working snapshot of the measurement system, and the internal working signal estimate to incorporate the next measurement and the corresponding measurement vector; and
    removing an oldest measurement and a corresponding oldest measurement vector, and an effect of the committed subset of coefficients.

2. The method of claim 1 wherein the streaming signal in the sliding window is sparse when appropriately transformed.

3. The method of claim 1 wherein the streaming signal in the sliding window is compressible when appropriately transformed.

4. The method of claim 1 wherein refining further comprises:
    computing an unexplained residual using the internal working signal estimate, the working set of measurements, and the working snapshot of the measurement system;
    identifying locations of signal components that best account for the unexplained residual;
    combining locations of the current internal signal estimate components with the locations of the signal that best account for the unexplained residual;
    estimating the signal components over the combined locations produced by the combining using the working set of measurements and the working snapshot of the measurement system; and
    keeping only most significant components and the associated locations from the estimating, and producing the most significant components for the internal working signal estimate.

5. The method of claim 1 wherein the refreshing further comprises:
    setting a next external working signal estimate to a weighted sum of a previous external working signal estimate and the refined internal working signal estimate produced by the refining.

6. The method of claim 1, wherein the committing further comprises:
    producing first R coefficients of the external working signal estimate at the output, wherein R is an integer downsampling rate.

7. The method of claim 6, wherein the updating further comprises:
    appending the next measurement to an end of the set of working measurements;
    appending zero-content columns after a last column of the working snapshot of the measurement system;
    appending the next measurement vector after a row of the working snapshot of the measurement system;
    removing an oldest measurement from the set of working measurements;
    removing a corresponding oldest measurement vector from the working snapshot of the measurement system;
    removing the first R columns corresponding to the committed coefficients from the working snapshot of the measurement system;
    subtracting the effect of the committed coefficients from the working signal measurements; and
    shifting the internal working signal estimate by R coefficients.

8. The methods of claim 1 or claim 4, wherein the method is applied concurrently to multiple signals.

* * * * *